United States Patent [19]

Wharton

[11] Patent Number: 5,373,263
[45] Date of Patent: Dec. 13, 1994

[54] TRANSVERSE MODE ELECTRON BEAM MICROWAVE GENERATOR

[75] Inventor: Lawrence E. Wharton, Beltsville, Md.

[73] Assignee: The United States of America as represented by the United States National Aeronautics and Space Administration, Washington, D.C.

[21] Appl. No.: 41,022

[22] Filed: Mar. 22, 1993

[51] Int. Cl.⁵ .............................................. H03B 5/18
[52] U.S. Cl. ...................................... 331/96; 331/79; 331/91; 331/80
[58] Field of Search .................... 331/79, 96, 83, 84, 331/80, 81, 82; 315/5, 5.24, 5.26, 5.28, 5.53

[56] References Cited

U.S. PATENT DOCUMENTS

| | | | |
|---|---|---|---|
| 2,409,227 | 10/1946 | Shockley | 331/80 |
| 2,436,397 | 2/1948 | Morton | 331/79 |
| 2,962,585 | 11/1960 | Bolef et al. | 331/87 |
| 3,178,653 | 4/1965 | Smith | 331/6 |
| 3,253,231 | 5/1966 | Smith, Jr. | 331/79 |
| 3,424,996 | 1/1969 | Hamilton | 331/84 |
| 4,286,230 | 8/1981 | Morrison et al. | 331/96 |
| 4,380,744 | 4/1983 | Kantorowicz | 331/96 |
| 4,413,207 | 11/1983 | Kageyama et al. | 315/5.52 |
| 4,480,210 | 10/1984 | Preist et al. | 315/4 |
| 4,567,449 | 1/1986 | Bert et al. | 331/96 |
| 4,588,965 | 5/1986 | Cook | 331/91 |
| 4,621,218 | 11/1986 | Jasper, Jr. et al. | 315/3.6 |
| 4,642,571 | 2/1987 | Minami et al. | 331/96 |
| 4,674,513 | 6/1987 | Jasper, Jr. | 128/653 |
| 4,700,146 | 10/1982 | Barton | 331/7 |
| 5,187,408 | 2/1993 | Jodicke et al. | 331/79 |

Primary Examiner—Raymond A. Nelli
Attorney, Agent, or Firm—Robert D. Marchant; Guy M. Miller; Samuel J. Petuchowski

[57] ABSTRACT

An electron beam microwave device having an evacuated interaction chamber to which are coupled a resonant cavity which has an opening between the resonant cavity and the evacuated interaction chamber and an electron gun which causes a narrow beam of electrons to traverse the evacuated interaction chamber. The device also contains a mechanism for feeding back a microwave electromagnetic field from the resonant cavity to the evacuated interaction chamber in such a way as to modulate the direction of propagation of the electron beam, thereby further amplifying the microwave electromagnetic field. Furthermore, provision is made for coupling the electromagnetic field out of the electron beam microwave device.

15 Claims, 3 Drawing Sheets

TRANSVERSE MODE ELECTRON BEAM MICROWAVE GENERATOR

ORIGIN OF THE INVENTION

The invention described herein was made by an employee of the United States Government, and may be manufactured and used by or for the Government for governmental purposes without the payment of any royalty thereon or therefor.

TECHNICAL FIELD

This invention relates to electron tube oscillators in general, and more particularly to electron tube oscillators having electron beam deflection for generating microwave radiation.

BACKGROUND ART

One class of prior art devices for generating and amplifying microwave radiation employs the interaction of a beam of electrons with an electromagnetic field inside an electron tube which is configured in a manner so as to provide for extraction of energy from rapidly streaming electrons in order to enhance the strength of an electromagnetic field. Such devices include klystrons, magnetrons, and travelling wave tubes, all capable of varied embodiments, but sharing the properties of a mechanism for accelerating the electrons into a stream which is initially uniform in velocity and direction, and a wave-supporting structure which allows for the resonant containment of an electromagnetic field. The interaction of the field with the beam of electrons allows the energy in the beam, which is initially in the form of direct current, to be transformed into alternating current at the frequency of the electromagnetic field. The energy in the electromagnetic field is then coupled out of the device and used for purposes as diverse as radar and microwave cooking. While there is no lower limit to the frequency at which such an oscillator can operate, there are high-frequency limitations imposed by losses of magnetic energy within the wave-supporting structure. The characteristic dimensions of the wave support structure are of the order of the wavelength of radiation to be generated. Surface roughness of the structure causes additional losses of electromagnetic energy in addition to losses due to interaction of the fields with the walls of the structure which increase as the square root of the frequency. The losses due to geometrical imperfections of fabrication grow more rapidly with frequency when the scale of the roughness is comparable to the wavelength of the radiation. To overcome these losses, higher electron densities are required within the region of interaction with the field, but these, in turn, are also limited by the natural tendency of charged particles to repel one another. Generation of power levels useful for communications by devices of this class is limited, in practice, to frequencies below approximately 100 GHz.

All klystrons currently operating may be referred to as operating in a longitudinal mode, in that their operation entails the bunching of electrons in a beam and the interaction of the bunched electrons with an electromagnetic field directed parallel to the motion of the electrons in the beam. Klystron devices of this sort are used to generate and to amplify microwave radiation.

In a klystron, the electron beam must interact in proper phase with the extracted electromagnetic field in order to amplify it. Operation of klystrons is thus sensitive to the time of flight between electron bunching and energy extraction, and thus to the voltage applied to accelerate the beam. This is true both in the linear and reflex configurations.

STATEMENT OF THE INVENTION

It is therefore an object of the present invention to provide for a new and improved electron beam microwave generator.

It is another object of the present invention to provide for an electron beam microwave generator operating in a transverse mode of beam modulation.

It is a further object of the present invention to provide for an electron beam microwave generator in which the electrons are not bunched and thus no frequency limitation is imposed by the antibunching tendency of like-charged electrons.

It is an additional object of the present invention to provide for an electron beam microwave generator in which only simple geometrical structures are employed so that fabrication tolerances for high frequency operation will more readily be met.

It is still another object of the present invention to extend the operation of electron beam microwave oscillators to frequencies in the range above 100 GHz, higher than those currently accessible to longitudinal mode klystron devices.

It is a still further object of the present invention to provide for an electron beam microwave generator in which there is no critical phase relationship between a specific bunch of electrons and the electromagnetic field.

It is still another object of the present invention to reduce the sensitivity of the oscillation frequency to the velocity of the accelerating voltage applied to the electron beam.

An additional object of the present invention is to provide a simple means of imparting modulation to the generated microwave field by varying the voltage used to accelerate the electron beam.

SUMMARY OF THE INVENTION

The above and other objects of the present invention are achieved by providing an electron beam microwave device having an evacuated interaction chamber to which are coupled a resonant cavity which has an opening between the resonant cavity and the evacuated interaction chamber and an electron gun which causes a narrow beam of electrons to traverse the evacuated interaction chamber. The device also contains a mechanism for feeding back a microwave electromagnetic field from the resonant cavity to the evacuated interaction chamber in such a way as to modulate the direction of propagation of the electron beam, thereby further amplifying the microwave electromagnetic field. Furthermore, provision is made for coupling the electromagnetic field out of the electron beam microwave device.

DETAILED DESCRIPTION OF THE INVENTION

Figure 1:
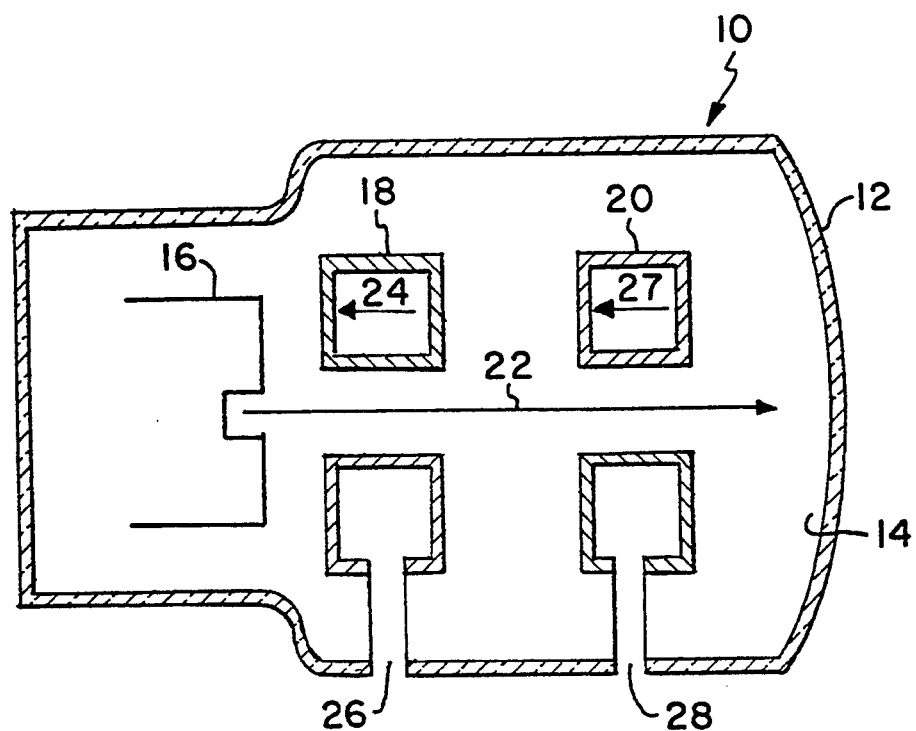
FIG. 1 is a cross-sectional illustration of a conventional prior art klystron tube.
Figure 2:
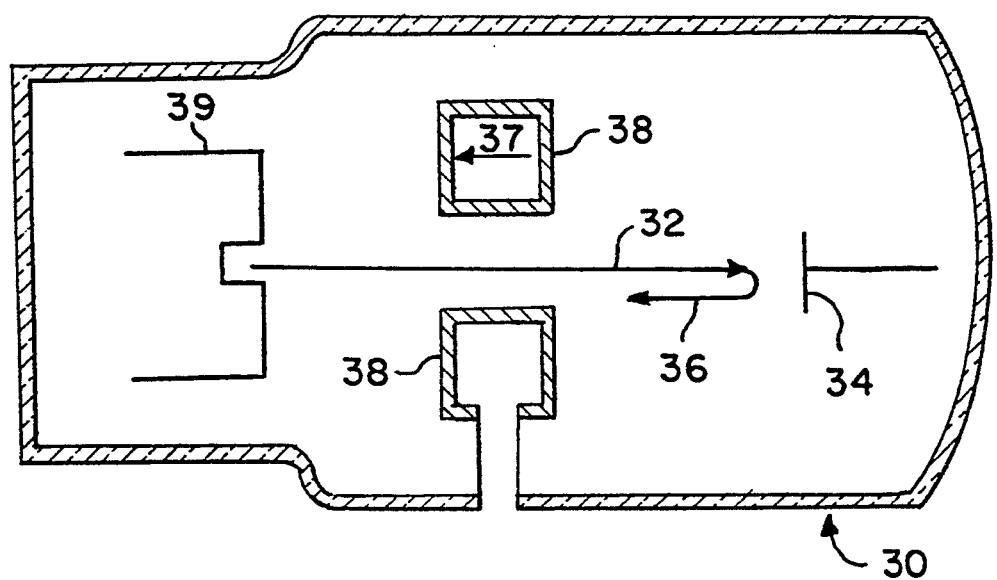
FIG. 2 is a cross-sectional illustration of a prior art reflex klystron tube.

Two prior art instruments for generating and amplifying microwave radiation by means of a klystron tube are shown in cross-section in FIGS. 1 and 2. Klystron 10 generally shown in FIG. 1, consists essentially of glass envelope 12, enclosing evacuated chamber 14 which contains electron gun 16, and two toroidal cavity resonators 18 and 20. The components shown are figures of revolution around an axis demarcated by electron beam 22 which emanates from electron gun 16. A microwave electromagnetic field, designated by arrow 24, is applied to toroidal cavity resonator 18 (also known in the industry as the 'buncher') via input port 26 and causes the electrons which make up electron beam 22 to be bunched in a pattern corresponding to the wavelength of the applied electromagnetic field 24. The bunched electrons of electron beam 22, in turn, induce an amplified microwave electromagnetic field 27 of the same or harmonic frequency in cavity resonator 20 (also known in the industry as the 'extractor'). By feeding back a portion of the amplified microwave field 27 from output port 28 via an external circuit (not shown), oscillation is sustained in klystron 10.

The reflex klystron 30 generally shown in FIG. 2, differs from klystron 10 of FIG. 1 in that electron beam 32 is reflected back along itself by means of a negative voltage applied at reflector 34 relative to electron gun 39 so that reflected electron beam 36 re-encounters microwave field 37 at resonator 38 in the proper phase so that resonator 38 serves both as buncher and extractor.

Figure 3:
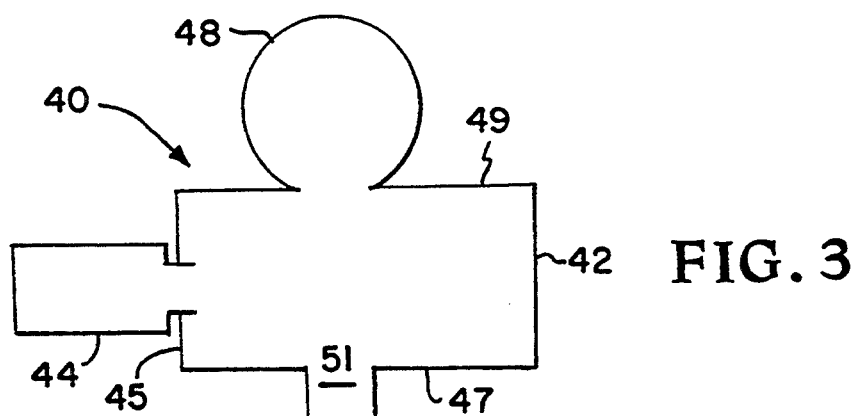
FIG. 3 is a top view of the preferred embodiment of the present invention.
Figure 4:
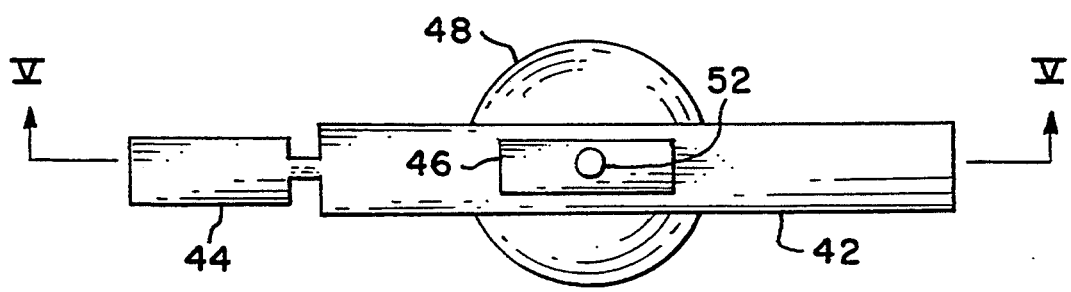
FIG. 4 is a side view of the preferred embodiment of the present invention shown in FIG. 3.

Referring now to FIGS. 3 through 7, wherein like reference numerals designate identical or corresponding parts, and more particularly to FIGS. 3 and 4 wherein a top and side view, respectively, of the preferred embodiment of the invention are presented. The electron beam microwave device generally shown as number 40 has an evacuated interaction chamber 42 and an electron gun 44 which is coupled to one side 45 of evacuated interaction chamber 42 so that a beam of electrons 60, shown in FIG. 5, can enter evacuated interaction chamber 42. A resonant cavity 46, which is preferably rectangular in cross section perpendicular to its long dimension, is coupled to an adjacent side 47 of evacuated interaction chamber 42 with an opening 63, shown in FIG. 5, between the resonant cavity 46 and the evacuated interaction chamber 42. Resonant cavity 46 is preferably made out of metal but another electrically conductive material can be used. A hollow sphere 48, preferably metal, however another electrically conductive material can be used, is coupled to another adjacent side 49 of evacuated interaction chamber 42 with an opening 65, shown in FIG. 5, between hollow sphere 48 and evacuated interaction chamber 42. Hollow metal sphere 48 serves to feed a microwave electromagnetic field as indicated by arrow 62, shown in FIG. 5, contained within resonant cavity 46 back into evacuated interaction chamber 42 in order to modulate the direction of propagation of the electrons inside evacuated interaction chamber 42.

The dimensions of resonant cavity 46 and hollow sphere 48 are low-order multiples of the wavelength of operation. Thus, for operation at a typical frequency of 90 Gigahertz, the internal dimensions are of the order of one centimeter in length. Since the device is small and since its operation does not require bunching of similarly charged electrons, the electron beam microwave device described here is capable of higher frequency oscillation than those currently accessible to longitudinal mode klystron devices.

Figure 5:
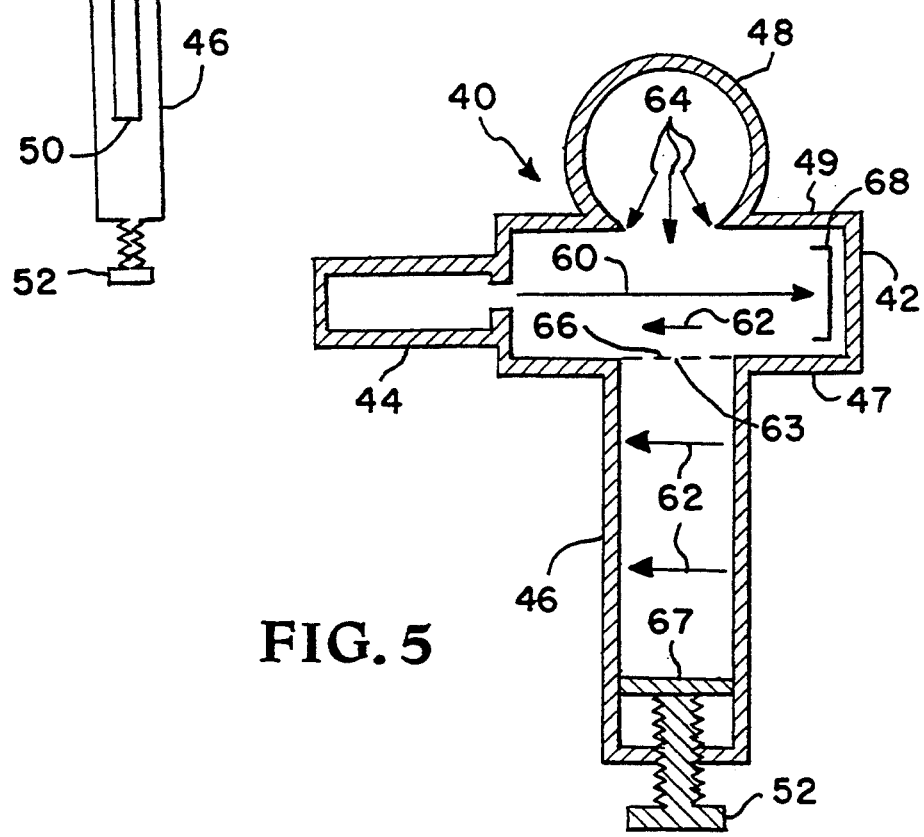
FIG. 5 is a top view in cross-section of the preferred embodiment of FIG. 4 taken along the lines V—V of FIG. 4.

While resonant cavity 46 and hollow metal sphere 48 are evacuated in the preferred embodiment, either or both may also be filled with one of various dielectric materials such as TEFLON which can support microwave fields and which are well known in the art. A window 50 in wall 51 of resonant cavity 46 serves to couple microwave radiation, shown by arrows 80, 82, and 84 in FIG. 5, generated within electron beam microwave device 40, to the outside of electron beam microwave device 40 so that the microwave radiation, shown by arrows 80, 82, and 84 in FIG. 5, can be utilized for such purposes as communication, radar imaging and ranging, or quality control in the production of plastics. The manner of output coupling through window 50 is well known in the art and is not part of this invention. A screw 52 used to drive an internal stub 67, shown in FIG. 5, illustrates one method of tuning the resonant frequency of the resonant cavity 46. Such method of tuning a resonant cavity 46 is also well known in the art and is not part of this invention.

FIG. 5 illustrates the preferred embodiment of the present invention in cross section taken along lines V—V of FIG. 4. The beam of electrons is represented by dashed line 60 emanating at electron gun 44 and traversing evacuated interaction chamber 42. The microwave electromagnetic field is depicted by field lines 62 within resonant cavity 46 and evacuated interaction chamber 42, and by field lines 64 within evacuated sphere 48. A grid 66, made preferably of free standing metal wires spaced between one another by a distance equal approximately to half the wavelength of the microwave radiation 62, is interposed at the surface where resonant cavity 46 is connected to interaction chamber 42. Grid 66 serves, as does movable tuning stub 67, to define nodes (planes of zero electric field) of the microwave electromagnetic field 62 generated in resonant cavity 46. Adjustment of the distance between movable tuning stub 67 and fixed grid 66 serves to tune the frequency of the generated radiation 62, which is thus insensitive to the accelerating voltage applied to electron beam 60. Additionally, positively charged metal plate 68 collects electrons which have traversed interaction chamber 42 and spent their energy by interaction with microwave electromagnetic field 62.

Figure 6:
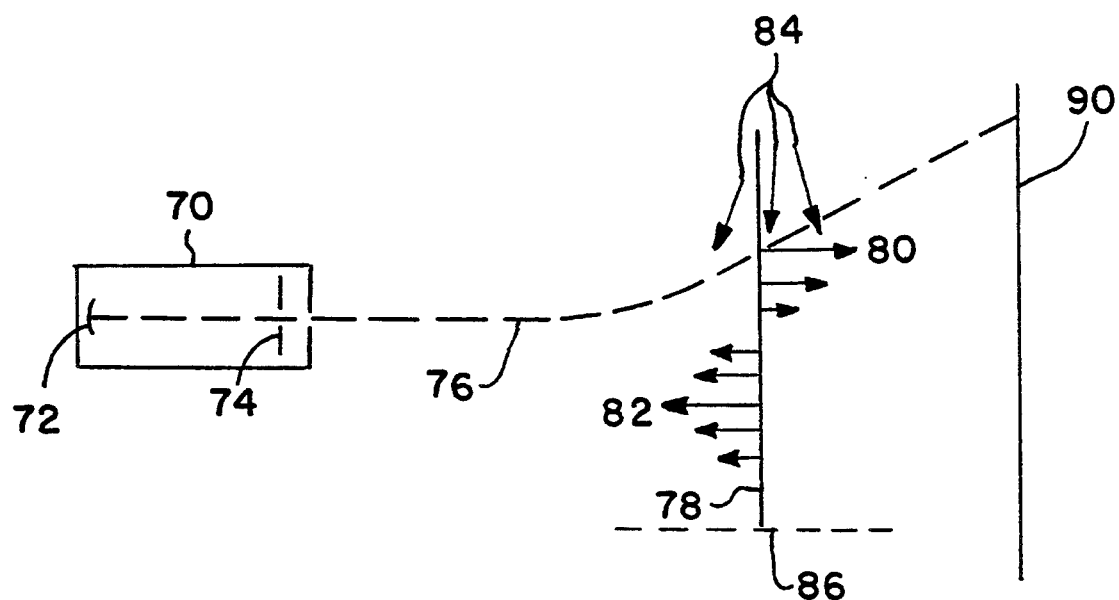
FIG. 6 is a schematic diagram of the present invention.
Figure 7:
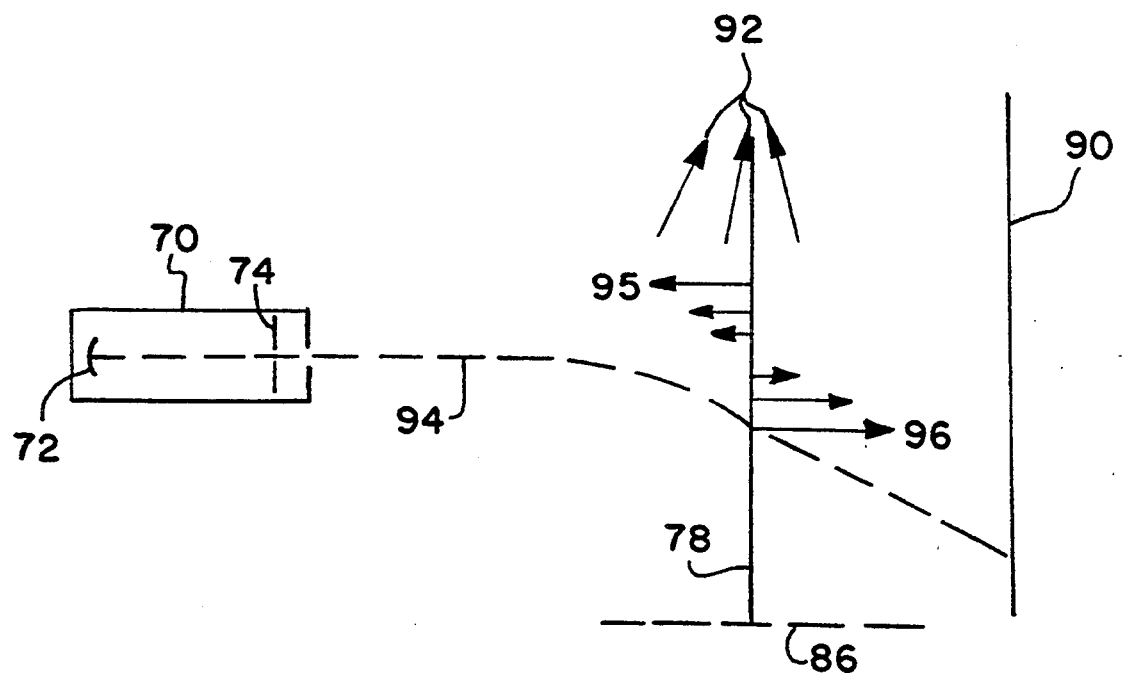
FIG. 7 is a schematic diagram of the present invention as represented in FIG. 6 depicted at later time than shown in FIG. 6.

Referring now to FIGS. 6 and 7, schematic diagrams of the present invention are presented to illustrate the physical principle of its operation. Electrons depicted by dashed line 76 are generated and accelerated by any conventional electron gun 70 which contains a cathode 72 and an accelerating anode 74. Electrons 76 exit electron gun 70 and are accelerated toward collector plate 90 along a virtual path depicted by electrons 76. Electrons 76 encounter and interact with microwave electromagnetic field 80, 82, 84 in a manner to be discussed.

The microwave electromagnetic field is designated in FIGS. 6 and 7 by means of arrows 80, 82, 84 whose direction indicates the direction in which the linear polarization of electromagnetic field 80, 82, 84 is pointing at a particular moment, and whose length indicates the amplitude of electromagnetic field 80, 82, 84 at the indicated position at the same particular moment. Electromagnetic field 80, 82, 84 has two components: a transverse component designated by arrows 80 and 82, and radial component 84. The electromagnetic field 80, 82, 84 is forced to conform to the indicated orientation of its polarization by virtue of the resonance cavity 46, in the case of the transverse component 80, 82, and by virtue of the hollow sphere 48, in the case of the radial component 84. Transverse component 80, 82 of electromagnetic field 80, 82, 84 has zero amplitude at metal grid 86. Along axis 78 which is perpendicular to the direction of electron beam 76 and which continues to form a diameter of hollow sphere 48, the amplitude of the transverse component component 80, 82 of electromagnetic field 80, 82, 84 varies sinusoidally with distance with a period equal to the wavelength of electromagnetic field 80, 82, 84. A fraction of the energy in transverse component 80, 82 of electromagnetic field 80, 82, 84 is coupled into hollow sphere 48 and is transformed there into a radial component 84 of the electromagnetic field 80, 82, 84. Radial component 84 of the electromagnetic field 80, 82, 84, interacts, in turn, with electron beam 76 and diverts electron beam 76 from the shortest path between electron gun 70 and collector plate 90.

The phase of the radial component 84 of electromagnetic field 80, 82, 84 is such that radial component 84 of electromagnetic field 80, 82, 84 pulls electron beam 76 in a sense in which transverse component 80, 82 of electromagnetic field 80, 82, 84 is opposite to the direction of the streaming electrons 76, such as at point 80, and energy from electron beam 76 is transferred to transverse component 80, 82 of electromagnetic field 80, 82, 84. The amount of energy transferred to electromagnetic field 80, 82 depends on the intensity of electron beam 76, so that the amplitude of the generated electromagnetic field 80, 82, 84 may be modulated by varying the voltage between cathode 72 and anode 74 used in electron gun 70 to accelerate electron beam 76.

A time which is later by one half cycle of electromagnetic field 80, 82, 84 is depicted in FIG. 7. Radial component 92 of electromagnetic field 92, 95, 96 will have changed its direction, diverting electron beam 94 in the opposite sense, now transferring energy again to transverse component 95, 96 of electromagnetic field 92, 95, 96 at a point 96 where the polarization direction of transverse component 95, 96 of the electromagnetic field 92, 95, 96 is opposite to the direction of streaming electrons 94.

The electron beam microwave device 40 does not suffer the frequency limitations of space-charge induced antibunching and the frequency of its radiation is insensitive to the energy of electrons 60. Higher frequency operation than that attainable by prior art devices is thus achievable. Obviously, many modifications and variations of the present invention are possible in light of the above teachings. It is therefore to be understood that within the scope of the appended claims the invention may be practiced otherwise than as specifically described.

Accordingly, the invention having been described in its best embodiment and mode of operation, that which is desired to be claimed by Letters Patent is:

1. An electron beam microwave device comprising:
   an evacuated interaction chamber;
   a means for generating a beam of electrons coupled to said evacuated interaction chamber;
   said beam of electrons substantially traversing said evacuated interaction chamber substantially along an axis of injection;
   a resonant cavity coupled to said evacuated interaction chamber, having an opening between said resonant cavity and said evacuated interaction chamber;
   a means for feeding back a microwave electromagnetic field from said resonant cavity to said evacuated interaction chamber for modulating the direction of propagation substantially transverse to said axis of injection of said electron beam; and
   a means for transmitting said microwave electromagnetic field out of said electron beam microwave device.

2. The electron beam microwave device of claim 1 wherein said means for feeding back said microwave electromagnetic field includes an electrically conductive sphere, coupled to said evacuated interaction region.

3. The electron beam microwave device of claim 2 wherein said electrically conductive sphere is filled with a dielectric material.

4. The electron beam microwave device of claim 1 wherein said means for generating a beam of electrons includes a means for applying a negative voltage to a cathode and a positive voltage to an accelerating anode.

5. The electron beam microwave device of claim 4 wherein the amplitude of said microwave electromagnetic field is modulated by varying said voltage applied between said cathode and said accelerating anode.

6. The electron beam microwave device of claim 1 further including a means of collecting said beam of electrons after traversal of said evacuated interaction region.

7. The electron beam microwave device of claim 6 wherein said means of collecting said beam of electrons includes a positively charged plate.

8. The electron beam microwave device of claim 7 wherein said positively charged plate is a metal plate.

9. The electron beam microwave device of claim 1 further including a means for tuning said resonant cavity.

10. The electron beam microwave device of claim 9 wherein said means for tuning said resonant cavity includes an electrically conducting stub within said resonant cavity and a means for translating said electrically conducting stub along the length of the interior of said resonant cavity.

11. The electron beam microwave device of claim 10 wherein said means for translating said electrically conducting stub includes a screw protruding from said resonant cavity and coupled to said electrically conducting stub.

12. The electron beam microwave device of claim 1 further including a means for establishing a voltage potential reference for said microwave electromagnetic field at said opening between said resonant cavity and said evacuated interaction region.

13. The electron beam microwave device of claim 12 wherein said means for establishing a voltage potential reference for said microwave electromagnetic field at said opening between said resonant cavity and said evacuated interaction region includes an electrically conducting grid interposed at said opening between said resonant cavity and said evacuated interaction region 14. The electron beam microwave device of claim 12 wherein said means for establishing a voltage potential reference for said microwave electromagnetic field at said opening between said resonant cavity and said evacuated interaction region includes an electrically conducting mesh interposed at said opening between said resonant cavity and said evacuated interaction region.

15. The electron beam microwave device of claim 1 wherein said means for transmitting said microwave electromagnetic field includes one or more microwave transmitting windows coupled to said resonant cavity.

* * * * *